(12) United States Patent
Larson et al.

(10) Patent No.: US 8,418,649 B2
(45) Date of Patent: Apr. 16, 2013

(54) COMPOSITE SHOWERHEAD ELECTRODE ASSEMBLY FOR A PLASMA PROCESSING APPARATUS

(75) Inventors: Dean Jay Larson, Pleasanton, CA (US); Tom Stevenson, Gilroy, CA (US); Victor Wang, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 1152 days.

(21) Appl. No.: 12/337,323

(22) Filed: Dec. 17, 2008

(65) Prior Publication Data

US 2009/0163034 A1      Jun. 25, 2009

Related U.S. Application Data

(60) Provisional application No. 61/008,152, filed on Dec. 19, 2007.

(51) Int. Cl.
| | |
|---|---|
| *C23C 16/455* | (2006.01) |
| *C23C 16/50* | (2006.01) |
| *C23C 16/505* | (2006.01) |
| *C23C 16/509* | (2006.01) |
| *H01L 21/306* | (2006.01) |
| *C23F 1/00* | (2006.01) |
| *C23C 16/06* | (2006.01) |
| *C23C 16/22* | (2006.01) |

(52) U.S. Cl.
USPC ............ 118/723 E; 118/723 ER; 156/345.43; 156/345.44; 156/345.45; 156/345.46; 156/345.47

(58) Field of Classification Search ............... 118/723 E, 118/723 ER; 156/345.43, 345.44, 345.45, 156/345.46, 345.47
See application file for complete search history.

(56) References Cited

U.S. PATENT DOCUMENTS

| 4,340,462 A | 7/1982 | Koch |
| 4,908,095 A * | 3/1990 | Kagatsume et al. ............ 216/67 |

(Continued)

FOREIGN PATENT DOCUMENTS

| JP | 9-298233 A | 11/1997 |
| JP | 2001-226656 A | 8/2001 |

(Continued)

OTHER PUBLICATIONS

Dow Corning, Sep. 5, 2012, Dow Corning Website Describing 93-500 material.*

(Continued)

*Primary Examiner* — Rudy Zervigon
(74) *Attorney, Agent, or Firm* — Buchanan Ingersoll & Rooney PC

(57) ABSTRACT

A showerhead electrode for a plasma processing apparatus includes an elastomeric sheet adhesive bond between mating surfaces of an electrode and a backing member to accommodate stresses generated during temperature cycling due to mismatch in coefficients of thermal expansion. The elastomeric sheet comprises a thermally conductive silicone adhesive able to withstand a high shear strain of ≧300% in a temperature range of room temperature to 300° C. such as heat curable high molecular weight dimethyl silicone with fillers. The sheet form adhesive has bond thickness control for parallelism of bonded surfaces over large areas. The sheet adhesive may be cast or die cut into pre-form shapes that can conform to irregularly shaped features, maximize surface contact area with mating electrode surfaces, and installed into cavities of the mating assembly. Installation can be manually, manually with installation tooling, or with automated machinery. Composite layers of sheet adhesive having different physical properties can be laminated or coplanar.

12 Claims, 11 Drawing Sheets

U.S. PATENT DOCUMENTS

| | | | |
|---|---|---|---|
| 4,948,458 A | 8/1990 | Ogle | |
| 5,074,456 A * | 12/1991 | Degner et al. | 228/121 |
| 5,200,232 A | 4/1993 | Tappan et al. | |
| 5,262,029 A | 11/1993 | Erskine et al. | |
| 5,569,356 A * | 10/1996 | Lenz et al. | 438/729 |
| 5,690,795 A | 11/1997 | Rosenstein et al. | |
| 5,744,199 A | 4/1998 | Joffre et al. | |
| 5,766,364 A * | 6/1998 | Ishida et al. | 118/725 |
| 5,801,915 A | 9/1998 | Kholodenko et al. | |
| 5,820,723 A | 10/1998 | Benjamin et al. | |
| 5,838,529 A | 11/1998 | Shufflebotham et al. | |
| 5,863,376 A | 1/1999 | Wicker et al. | |
| 5,906,683 A * | 5/1999 | Chen et al. | 118/724 |
| 5,951,814 A | 9/1999 | Saito et al. | |
| 5,969,934 A | 10/1999 | Larsen | |
| 6,071,630 A | 6/2000 | Tomeru et al. | |
| 6,073,577 A * | 6/2000 | Lilleland et al. | 118/723 E |
| 6,074,518 A * | 6/2000 | Imafuku et al. | 156/345.46 |
| 6,095,083 A | 8/2000 | Rice et al. | |
| 6,148,765 A | 11/2000 | Lilleland et al. | |
| 6,194,322 B1 | 2/2001 | Lilleland et al. | |
| 6,227,140 B1 | 5/2001 | Kennedy et al. | |
| 6,256,187 B1 | 7/2001 | Matsunaga et al. | |
| 6,365,063 B2 | 4/2002 | Collins et al. | |
| 6,376,385 B2 | 4/2002 | Lilleland et al. | |
| 6,378,378 B2 | 4/2002 | Fisher | |
| 6,379,806 B1 | 4/2002 | Takamura et al. | |
| 6,408,786 B1 | 6/2002 | Kennedy et al. | |
| 6,475,336 B1 | 11/2002 | Hubacek | |
| 6,491,784 B2 | 12/2002 | Yamaguchi et al. | |
| 6,723,202 B2 | 4/2004 | Nagaiwa et al. | |
| 6,753,498 B2 | 6/2004 | Sirkis et al. | |
| 6,762,395 B2 | 7/2004 | Yagnik et al. | |
| 6,786,175 B2 * | 9/2004 | Dhindsa et al. | 118/723 E |
| 6,797,639 B2 | 9/2004 | Carducci et al. | |
| 6,813,134 B2 | 11/2004 | Tatsumi et al. | |
| 6,818,096 B2 * | 11/2004 | Barnes et al. | 156/345.43 |
| 6,827,815 B2 | 12/2004 | Hytros et al. | |
| 6,831,307 B2 | 12/2004 | Fujii | |
| 6,838,012 B2 | 1/2005 | Lenz | |
| 6,858,311 B2 | 2/2005 | Sumita et al. | |
| 6,881,608 B2 | 4/2005 | Wicker | |
| 6,882,537 B2 | 4/2005 | Barcley | |
| 6,890,861 B1 | 5/2005 | Bosch | |
| 6,899,109 B1 | 5/2005 | Nguyen | |
| 6,983,892 B2 | 1/2006 | Noorbakhsh et al. | |
| 7,019,956 B2 | 3/2006 | Fujii et al. | |
| 7,074,849 B2 | 7/2006 | Nakayoshi et al. | |
| 7,110,506 B2 | 9/2006 | Radley et al. | |
| 7,137,444 B2 | 11/2006 | Faybishenko et al. | |
| 7,196,283 B2 * | 3/2007 | Buchberger et al. | 219/121.43 |
| 7,220,497 B2 | 5/2007 | Chang | |
| 7,220,937 B2 * | 5/2007 | Hofman et al. | 219/121.55 |
| 7,270,713 B2 * | 9/2007 | Blonigan et al. | 156/345 |
| 7,296,534 B2 * | 11/2007 | Fink | 118/723 E |
| 7,337,745 B1 * | 3/2008 | Komino et al. | 118/723 E |
| 7,543,547 B1 * | 6/2009 | Kennedy et al. | 118/723 E |
| 7,644,745 B2 | 1/2010 | Le et al. | |
| 7,645,341 B2 * | 1/2010 | Kennedy et al. | 118/715 |
| 7,661,386 B2 * | 2/2010 | Kasai et al. | 118/666 |
| 7,712,434 B2 * | 5/2010 | Dhindsa et al. | 118/723 E |
| 7,854,820 B2 * | 12/2010 | De La Llera et al. | 156/345.34 |
| 7,861,667 B2 * | 1/2011 | Fischer et al. | 118/723 E |
| 7,862,682 B2 * | 1/2011 | Stevenson et al. | 156/345.34 |
| 7,939,778 B2 * | 5/2011 | Larson et al. | 219/121.43 |
| 8,080,107 B2 * | 12/2011 | Kennedy et al. | 118/715 |
| 8,147,648 B2 * | 4/2012 | Dhindsa | 156/345.43 |
| 8,161,906 B2 * | 4/2012 | Kadkhodayan et al. | 118/723 E |
| 2002/0048963 A1 | 4/2002 | Campbell et al. | |
| 2002/0108711 A1 * | 8/2002 | Kim | 156/345.33 |
| 2002/0127853 A1 | 9/2002 | Hubacek et al. | |
| 2003/0032301 A1 | 2/2003 | Dhindsa et al. | |
| 2003/0185729 A1 | 10/2003 | Ko et al. | |
| 2004/0074609 A1 * | 4/2004 | Fischer et al. | 156/914 |
| 2004/0149699 A1 * | 8/2004 | Hofman et al. | 219/121.43 |
| 2004/0187787 A1 | 9/2004 | Dawson et al. | |
| 2005/0028935 A1 * | 2/2005 | Wickramanayaka et al. | 156/345.34 |
| 2005/0056218 A1 | 3/2005 | Sun et al. | |
| 2005/0133160 A1 * | 6/2005 | Kennedy et al. | 156/345.34 |
| 2005/0178748 A1 * | 8/2005 | Buchberger et al. | 219/121.48 |
| 2005/0241766 A1 | 11/2005 | Dhindsa et al. | |
| 2007/0047170 A1 | 3/2007 | Sun et al. | |
| 2007/0068629 A1 * | 3/2007 | Shih et al. | 156/345.34 |
| 2007/0187038 A1 * | 8/2007 | Ren et al. | 156/345.43 |
| 2008/0090417 A1 * | 4/2008 | De La Llera et al. | 438/689 |
| 2009/0163034 A1 | 6/2009 | Larson et al. | 438/729 |
| 2010/0184298 A1 * | 7/2010 | Dhindsa | 438/710 |
| 2010/0224323 A1 * | 9/2010 | Himori | 156/345.33 |
| 2010/0224325 A1 * | 9/2010 | Himori et al. | 156/345.44 |
| 2010/0304571 A1 | 12/2010 | Larson et al. | |
| 2011/0155322 A1 * | 6/2011 | Himori et al. | 156/345.33 |
| 2011/0162799 A1 * | 7/2011 | Hayashi | 156/345.33 |
| 2011/0226420 A1 * | 9/2011 | Hayashi et al. | 156/345.34 |
| 2011/0226421 A1 * | 9/2011 | Hayashi | 156/345.44 |

FOREIGN PATENT DOCUMENTS

| | | |
|---|---|---|
| JP | 2005-523584 A | 8/2005 |
| WO | WO03/100817 A1 | 12/2003 |

OTHER PUBLICATIONS

Dow Corning, Sep. 5, 2012, Dow Corning Website Describing 93-500 MSDS.* http://www.matweb.com.*

NuSil Silicone Technology, CF1-135 High Technology Silicone Primer (Clear), Product Profile, Product Catalog, Jul. 26, 2005.

NuSil Silicone Technology, CV-2680-12 Controlled Volatility Film Adhesive, Product Profile, Product Catalog, Jul. 25, 2006.

NuSil Silicone Technology, CV-2943 Thermally Conductive, Controlled Volatility RTV Silicone, Product Profile, Product Catalog, Feb. 6, 2004.

NuSil Silicone Technology, CV-2946 Thermally Conductive, Controlled Volatility Silicone, Product Profile, Product Catalog, Feb. 24, 2005.

NuSil Silicone Technology, SP-120 SP-121 Silicone Primers, Product Profile, Product Catalog, Jul. 26, 2005.

Dhindsa, "Temperature controlled Hot Edge Ring Assembly", U.S. Appl. No. 12/222,789, filed Aug. 15, 2008.

Kadkhodayan et al., "Clamped Showerhead Electrode Assembly", U.S. Appl. No. 12/216,526, filed Jul. 7, 2008.

Kadkhodayan et al., "Showerhead Electrode", U.S. Appl. No. 12/216,525, filed Jul. 7, 2008.

Patrick et al., "Clamped Monolithic Showerhead Electrode", U.S. Appl. No. 12/216,524, filed Jul. 7, 2008.

Larson et al., "Film Adhesive For Semiconductor Vacuum Processing Apparatus", U.S. Appl. No. 61/008,144, filed Dec. 19, 2007.

International Search Report and Written Opinion dated May 28, 2009 for PCT/US2008/013782.

Official Action dated Aug. 21, 2012 for Japanese Application No. 2010-539464.

* cited by examiner

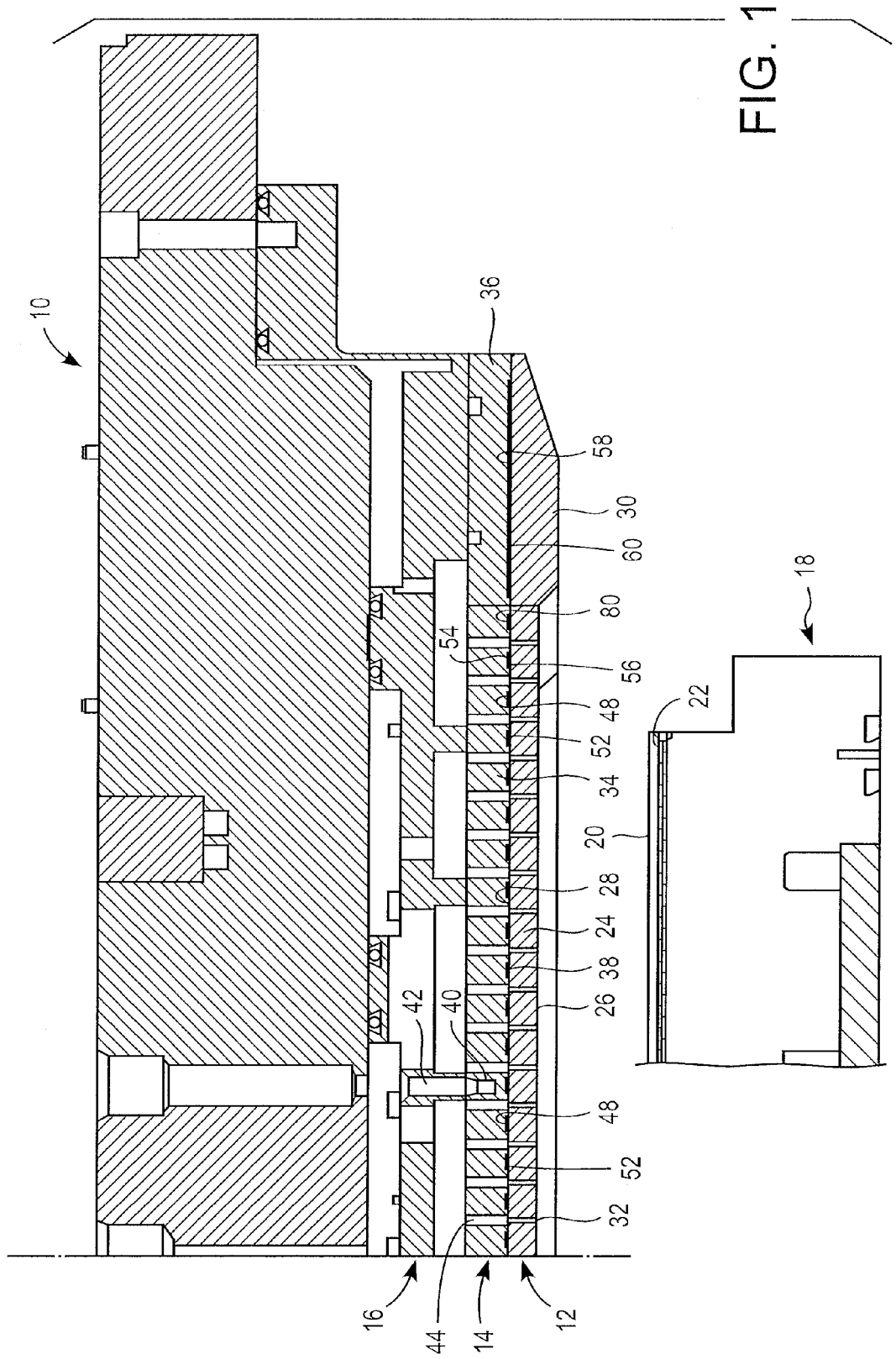

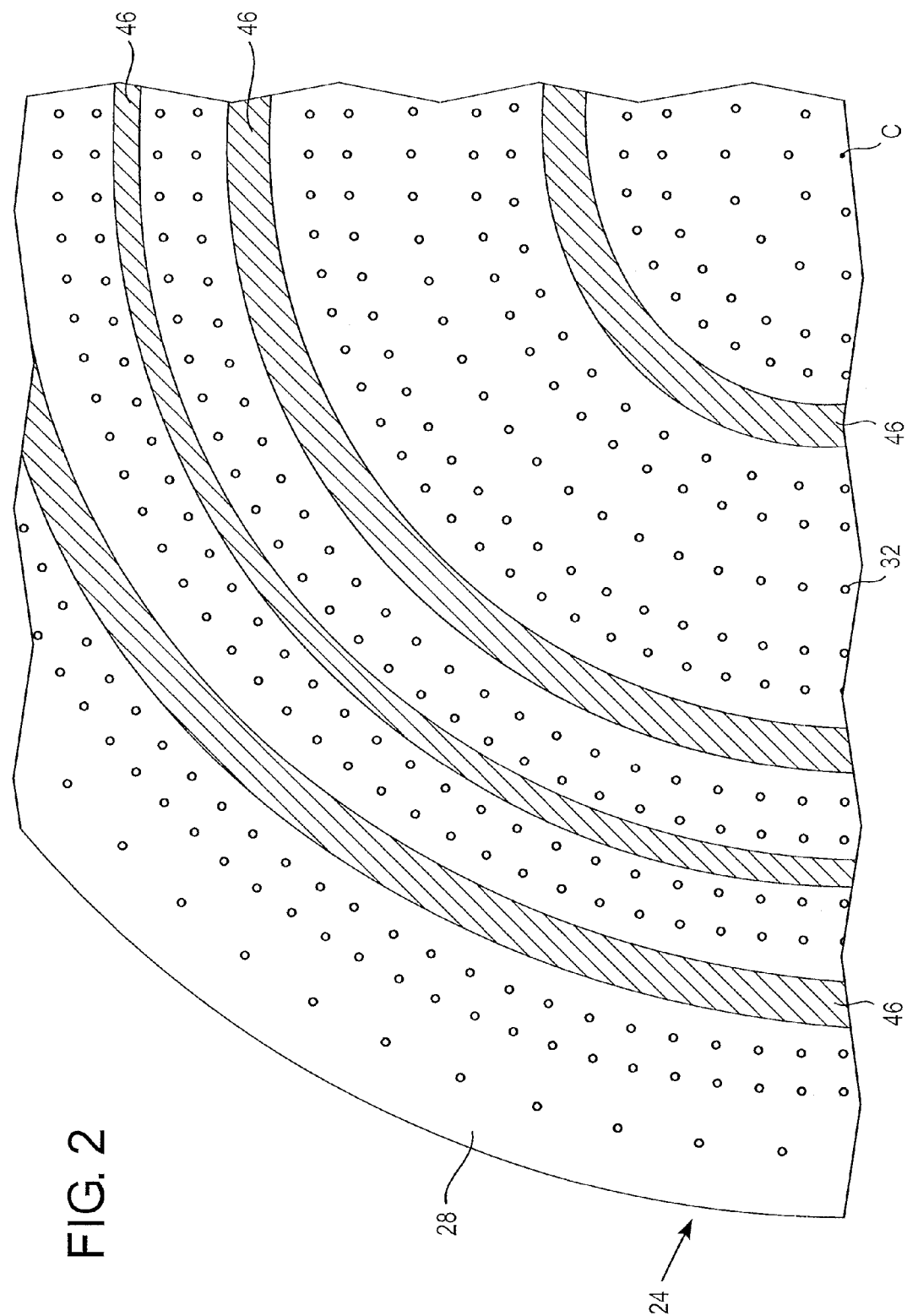

DETAIL OF A

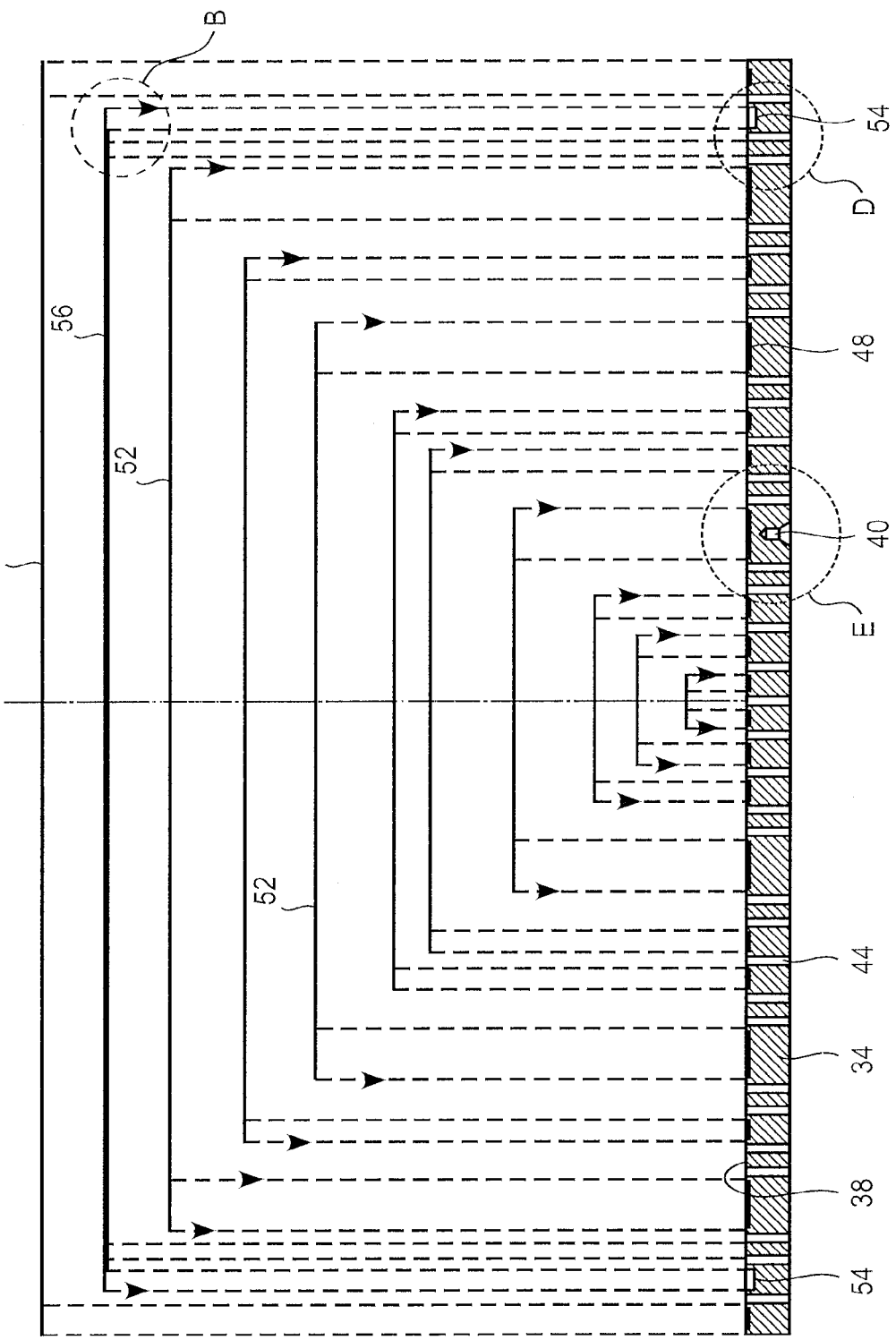

DETAIL OF B

DETAIL OF D

DETAIL OF E

COMPOSITE SHOWERHEAD ELECTRODE ASSEMBLY FOR A PLASMA PROCESSING APPARATUS

CROSS-REFERENCE TO RELATED APPLICATION

This application claims benefit of the filing date of U.S. Provisional Application Ser. No. 61/008,152 filed Dec. 19, 2007, the entire content of which is incorporated herein by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

SUMMARY

In an embodiment, a composite showerhead electrode assembly for generating plasma in a plasma processing apparatus is provided. The composite showerhead electrode assembly includes a backing plate comprising top and bottom surfaces with first gas passages therebetween, the bottom surface having bonded and unbonded regions, the first gas passages having outlets in unbonded regions to supply a process gas to an interior of the plasma processing apparatus, an electrode plate having a top surface, a plasma exposed bottom surface, and second gas passages extending therebetween and in fluid communication with the first gas passages, wherein the second gas passages have inlets in unbonded regions of the top surface of the electrode plate, and an elastomeric sheet adhesive joint disposed between mating surfaces at each of the bonded regions which allows movement in a lateral direction of the electrode plate relative to the backing plate during temperature cycling due to mismatch of coefficients of thermal expansion in the electrode plate and the backing plate.

In another embodiment, a method of joining components for a composite showerhead electrode assembly for a plasma processing apparatus is provided. A first surface of a sheet of uncured elastomeric adhesive is applied to a bottom surface of a backing member in a predetermined pattern of regions to be bonded which exclude regions to remain unbonded, the backing member having a top surface and a plurality of first gas passages extending between the top surface and the bottom surface and having outlets in unbonded regions. A top surface of an electrode is applied to a second surface of the uncured elastomeric sheet adhesive in a predetermined pattern of regions to be bonded, the electrode having a plasma exposed bottom surface and a plurality of second gas passages extending between the top surface and bottom surface of the electrode, wherein the second gas passages have inlets in unbonded regions of the top surface of the electrode. The top surface of the electrode is bonded to the bottom surface of the backing member by the elastomeric sheet adhesive therebetween, wherein the second gas passages are in fluid communication with the first gas passages.

Another embodiment provides a method of processing a semiconductor substrate in a plasma processing apparatus. A substrate is placed on a substrate support in a reaction chamber of a plasma processing apparatus. A process gas is introduced into the reaction chamber with the composite showerhead electrode assembly. A plasma is generated from the process gas in the reaction chamber between the showerhead electrode assembly and the substrate. The substrate is processed with the plasma.

In still another embodiment, a composite showerhead electrode assembly for a plasma processing apparatus is provided which includes a backing member having a bottom surface with regions to be bonded, excluding regions to remain unbonded, and a plurality of first gas passages extending between the bottom surface and a top surface of the backing member, wherein the first gas passages have outlets in regions to remain unbonded, to supply a process gas to an interior of a plasma processing apparatus; an electrode to generate plasma in the plasma processing apparatus, the electrode having a top surface with regions to be bonded and a plurality of second gas passages in fluid communication with the first gas passages, the second gas passages have inlets in regions to remain unbonded, extending through the electrode from the top surface to a plasma-exposed bottom surface of the electrode; and an uncured elastomeric sheet adhesive to be cured in a joint between mating surfaces of each of the regions to be bonded to allow movement in the lateral direction of the electrode relative to the backing member during temperature cycling due to mismatch of coefficients of thermal expansion of the backing member and electrode, wherein the sheet of elastomeric adhesive is a filled, heat-curable, unvulcanized elastomeric silicone sheet.

BRIEF DESCRIPTION OF THE DRAWINGS

FIG. 1 illustrates a cross-sectional view of a portion of an embodiment of a composite showerhead electrode assembly and a substrate support for a plasma processing apparatus.

FIG. 2 is a partial top view of an embodiment of an inner electrode, illustrating the application of an adhesive in a predetermined pattern in relation to gas passages.

FIG. 6 shows a cross section of an embodiment of sheet adhesive in the form of flat rings and a flat ring having an elevation jog to be placed on the backing plate shown in FIG. 1.

DETAILED DESCRIPTION

Figure 3A:
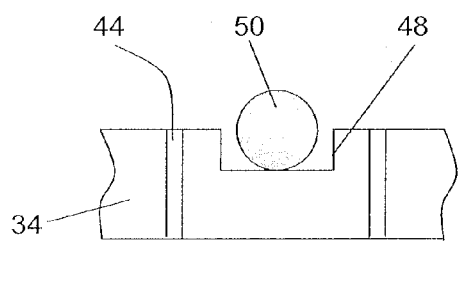
FIG. 3A illustrates a cross section portion of an embodiment of the backing plate shown in FIG. 1 supporting a bead of uncured paste or liquid adhesive prior to bonding.

Control of particulate contamination on the surfaces of semiconductor wafers during the fabrication of integrated circuits is essential in achieving reliable devices and obtaining a high yield. Processing equipment, such as plasma processing apparatuses, can be a source of particulate contamination. For example, the presence of particles on the wafer surface can locally disrupt pattern transfer during photolithography and etching steps. As a result, these particles can introduce defects into critical features, including gate structures, intermetal dielectric layers or metallic interconnect lines, resulting in the malfunction or failure of the integrated circuit component.

Reactor parts with relatively short lifetimes are commonly referred to as "consumables," for example, silicon electrodes. If the consumable part's lifetime is short, then the cost of ownership is high. Silicon electrode assemblies used in dielectric etch tools deteriorate after a large number of RF hours (time in hours during which radio frequency power is used to generate the plasma). Erosion of consumables and other parts generates particulate contamination in plasma processing chambers.

Showerhead electrode assemblies can be fabricated by bonding two or more dissimilar members with mechanically compliant and/or thermally conductive bonding materials, allowing for a multiplicity of function. The surfaces of components can be treated with a primer to enhance adhesion of the bonding material. To enhance electrical or thermal conductivity, the bonding material can contain electrically and/or thermally conductive filler particles. However, the primer and the filler particles associated with use of the bonding material can also be a potential source for particulate contamination. Additionally, because showerhead electrode assemblies contain gas passages, it is essential that the flow of the bonding material be controlled, such that the gas passages remain unobstructed by the bonding material. Methods for joining components of a plasma processing apparatus are provided that can reduce contamination originating from the bonding material and precisely control bonding material placement.

FIG. 1 illustrates an exemplary embodiment of a showerhead electrode assembly 10 for a plasma processing apparatus in which semiconductor substrates, e.g., silicon wafers, are processed. The showerhead electrode assembly is described, for example, in commonly-owned U.S. Patent Application Publication No. 2005/0133160, which is incorporated herein by reference in its entirety. The showerhead electrode assembly 10 comprises a showerhead electrode including a top electrode 12, a backing member 14 secured to the top electrode 12, and a thermal control plate 16. A substrate support 18 (only a portion of which is shown in FIG. 1), including a bottom electrode and optional electrostatic clamping electrode, is positioned beneath the top electrode 12 in the vacuum processing chamber of the plasma processing apparatus. A substrate 20 subjected to plasma processing is mechanically or electrostatically clamped on an upper support surface 22 of the substrate support 18.

In the illustrated embodiment, the top electrode 12 of the showerhead electrode includes an inner electrode member 24, or inner showerhead electrode 24, and an optional outer electrode member 30. The inner electrode member 24 is preferably a cylindrical plate (e.g., a plate composed of silicon) and includes plasma-exposed bottom surface 26 and top surface 28. The inner electrode member 24 can have a diameter smaller than, equal to, or larger than a wafer to be processed (e.g., up to about 8 inches (about 200 mm) or up to about 12 inches (about 300 mm) if the plate is made of silicon). In a preferred embodiment, the showerhead electrode assembly 10 is large enough for processing large substrates, such as semiconductor wafers having a diameter of 300 mm or larger. For 300 mm wafers, the top electrode 12 is at least 300 mm in diameter. However, the showerhead electrode assembly can be sized to process other wafer sizes or substrates having a non-circular configuration. In the illustrated embodiment, the inner electrode member 24 is wider than the substrate 20.

For processing 300 mm wafers, the outer electrode member 30 is provided to expand the diameter of the top electrode 12 from about 15 inches to about 17 inches. The outer electrode member 30 can be a continuous member (e.g., a continuous poly-silicon ring), or a segmented member (e.g., including 2-6 separate segments arranged in a ring configuration, such as segments composed of silicon). In embodiments of the top electrode 12 that include a multiple-segment, outer electrode member 30, the segments preferably have edges, which overlap each other to protect an underlying bonding material from exposure to plasma and do not have gas passages therein. The inner electrode member 24 preferably includes a pattern or array of gas passages 32 extending through the backing member 14 for injecting process gas into a space in a plasma reaction chamber located between the top electrode 12 and the bottom electrode 18. Optionally, the outer electrode member 30 also includes a pattern or array of gas passages (not shown) extending through a backing ring 36 of the backing member 14 for injecting process gas into the space in the plasma reaction chamber located between the top electrode 12 and the bottom electrode 18.

Silicon is a preferred material for plasma exposed surfaces of the inner electrode member 24 and the outer electrode member 30. Both electrodes are preferably made of high-purity, single crystal silicon, which minimizes contamination of substrates during plasma processing and also wears smoothly during plasma processing, thereby minimizing particles. Alternative materials that can be used for plasma-exposed surfaces of the top electrode 12 include SiC or AlN, for example.

In the illustrated embodiment, the backing member 14 includes an inner backing plate 34 and an outer backing ring 36, extending around the periphery of the backing plate 34. The backing plate 34 includes a bottom surface 38. In the embodiment, the inner electrode member 24 is co-extensive with the backing plate 34, and the outer electrode member 30 is co-extensive with the surrounding backing ring 36. However, the backing plate 34 can extend beyond the inner electrode member 24 such that a single backing plate can be used to support the inner electrode member 24 and the segmented outer electrode member 30. The inner electrode member 24 and the outer electrode member 30 are attached to the backing member 14 by a bonding material. A radio frequency (RF) ring gasket 80 can be located between the inner electrode member 24 and backing plate 34 near the outer periphery of the inner electrode member 24. The backing member 14 contains a plurality of holes 40 adapted to receive fastener members 42 for attaching the backing member 14 to thermal control plate 16. Backing plate 34 also includes multiple gas passages 44 extending through the backing plate 34 and in fluid communication with the gas passages 32 in inner electrode member 24. Optionally, backing ring 36 also includes multiple gas passages (not shown) extending through the backing ring 36 and in fluid communication with optional gas passages (not shown) in the outer electrode member 30.

The backing plate 34 and backing ring 36 are preferably made of a material that is chemically compatible with process gases used for processing semiconductor substrates in the plasma processing chamber, and is electrically and thermally conductive. Exemplary suitable materials that can be used to make the backing member 14 include aluminum, aluminum alloys, graphite and SiC. A preferred material for backing plate 34 and backing ring 36 is aluminum alloy 6061 which has not been anodized.

The top electrode 12 can be attached to the backing plate 34 and backing ring 36 with a suitable thermally and electrically conductive elastomeric bonding material that accommodates thermal stresses, and transfers heat and electrical energy between the top electrode 12 and the backing plate 34 and backing ring 36. The use of elastomers for bonding together surfaces of an electrode assembly is described, for example, in commonly-owned U.S. Pat. No. 6,073,577, which is incorporated herein by reference in its entirety.

In an embodiment, the elastomeric joint is an elastomeric sheet adhesive. The sheet adhesive can be any suitable elastomeric material such as a polymer material compatible with a vacuum environment and resistant to thermal degradation at high temperatures such as above 200° C. The elastomeric material can optionally include a filler of electrically and/or thermally conductive particles or other shaped filler such as wire mesh, woven or non-woven conductive fabric. Polymeric bonding materials which can be used in plasma environments above 160° C. include polyimide, polyketone, polyetherketone, polyether sulfone, polyethylene terephthalate, fluoroethylene propylene copolymers, cellulose, triacetates, silicone, and rubber.

Preferably, the sheet adhesive is a thermally conductive silicone adhesive bonding an upper electrode aluminum (Al) backing plate to a single crystal silicon (Si) showerhead. Preferably, the adhesive withstands a high shear strain of at least 200% (for example, 200 to 500% or 200 to 300%) in a temperature range from room temperature to 180° C. or higher (for example, from room temperature to 300° C.). Also preferably, the adhesive withstands a high shear strain of at least 300% (for example, 300 to 500%) in a temperature range of room temperature to 180° C. or higher (for example, room temperature to 300° C.). The adhesive can require on the order of 340 psi shear stress to achieve 300% strain (at room temperature to 180° C. or higher). Preferably, the adhesive requires on the order of 20 to 300 psi shear stress to achieve 300% strain (at room temperature to 180° C. or higher). For example, the adhesive can require 20-50 psi, 50-100 psi, 100-200 psi, or 200-300 psi shear stress to achieve 300% strain (at room temperature to 180° C. or higher). Most preferably, the adhesive can require on the order of 20-80 psi shear stress to achieve 200-400% strain (at room temperature to 180° C. or higher). It is preferred that the adhesive exhibits a linear shear stress/strain curve up to at least 200% or up to at least 300% in the temperature range from room temperature to 180° C. or from room temperature to 300° C., however nearly linear is also preferred. Also preferably, the adhesive has the lowest possible maximum shear stress at its ultimate failure, for example, less than or equal to 80 psi shear stress at 400% strain (in the temperature range from room temperature to 180° C. or room temperature to 300° C.).

Preferably, when the electrode plate is a disk of single crystal silicon with a diameter of at least 200 mm, the sheet adhesive exhibits a linear shear stress/strain curve up to at least 200% or up to at least 300% in the temperature range of room temperature to 180° C. or room temperature to 300° C., from a shear stress of 20 to 340 psi after about 5,000 temperature cycles of heating the electrode assembly from room temperature to 250° C.

When the aluminum backing plate and silicon showerhead thermally expand at different rates, the adhesive used to bond the two parts together couples the loads between the two parts. In contrast, when the adhesive is soft (low shear stress at a given strain according to an embodiment), the two parts will not induce stresses or diaphragm deflections into each other. Preferably, the backing plate and showerhead have a gap between non-bonded areas of the two mating surfaces. Diaphragm deflections can cause non-bonded areas of the backing plate surface to contact and rub along non-bonded areas of the showerhead surface during thermal expansion of the two parts. Such rubbing can wear particles off of one or both surfaces. Also when diaphragm deflections are present in the upper electrode assembly, higher localized contact loads can occur where the aluminum backing plate mates with the thermal control plate. This can lead to galling between the backing plate and the thermal control plate, generating particles within the system. Thus, when the adhesive is soft, less particulate contamination is generated due to little or no diaphragm deflection and little or no galling between the backing plate and thermal control plate from part distortion due to mismatching thermal coefficients of expansion.

The sheet adhesive can be formulated purely with high molecular weight dimethyl silicone and optional fillers, or it can also be matrixed around fiberglass screen (scrim), metallic screen, or mixed with glass microbeads and/or nanobeads of glass or other material to accommodate requirements of various applications. Preferably, the sheet adhesive is formulated with high molecular weight dimethyl silicone matrixed around $Al_2O_3$ microbeads. Composite layers of sheet adhesive can be produced and laminated which have different physical properties. In a preferred embodiment, coplanar areas of the sheet adhesive can be discretely formulated with different physical properties. Examples of physical properties are thermal conductivity, elasticity, tensile and shear strength, thickness, thermal coefficient of expansion, chemical resistance, particle erosion, and service temperature range.

For example, filled elastomer material may be subject to plasma erosion and has the potential of releasing conductive filler particles during plasma processing. During plasma processing, ions or radicals may migrate into gas passages 32 causing the erosion of the filled elastomer material at the joint interface around the holes. For example, aluminum alloy filler particles which originate from plasma eroded elastomer material can deposit on the wafer to produce defects during the etching process. In an embodiment for reducing the release of conductive filler particles, coplanar areas of the sheet adhesive can be discretely formulated with different filler particle densities. For example, areas of the sheet adhesive in the joint interface exposed to ions or radicals that have migrated through gas passages 32 can be unfilled (filler particle free) while coplanar areas of the sheet adhesive not exposed to the ions or radicals can include filler particles.

Preferably, the high purity elastomeric material of the elastomeric sheet adhesive is a heat curable thermally conductive silicone based on a diphenyl dimethyl silicone copolymer. The preferred elastomeric sheet adhesive is formulated from a thermally conductive room temperature unvulcanized silicone sheet under the trade name HCR-9800-30 available from NUSIL TECHNOLOGY. Preferably, the silicone sheet adhesive product uses an $Al_2O_3$ filler and is formulated to be heat curable, that is, preferably, the sheet adhesive does not require a separate activator application to initiate a cross-linking reaction. Preferably, the sheet adhesive is formulated with a suitable heat activated component to perform the cross-linking reaction at a predetermined curing temperature, for example, the heat activated cross-linking agent can be a peroxide. Such formulated adhesive sheet is available from NUSIL TECHNOLOGY.

In the case where the elastomer is an electrically conductive elastomer, the electrically conductive filler material can comprise particles of an electrically conductive material. Potential electrically conductive materials for use in the impurity sensitive environment of a plasma reaction chamber are nickel coated carbon powder, nickel powder, carbon nanotubes, graphene, graphite and a combination thereof.

In the case where the elastomer is a thermally conductive elastomer, the thermally conductive filler material can comprise particles of a thermally conductive metal or metal alloy. A preferred metal for use in the impurity sensitive environment of a plasma reaction chamber is an aluminum alloy, aluminum oxide ($Al_2O_3$) or boron nitride (BN). Preferably the elastomeric sheet adhesive has a low strength, can withstand a high shear strain and has a high thermal conductivity. Preferably, the thermal conductivity is at least 0.5 W/mK, more preferably at least 0.8 W/mK and most preferably at least 1.0 W/mK. A more uniform distribution of thermal and/or electrical conductor particles can be achieved in an elastomeric sheet adhesive than in a liquid or paste elastomeric bonding material.

In order to stay within the elastic limits of the finally formed joint, a suitable bond thickness can be used. That is, too thin of a sheet adhesive joint could tear during thermal cycling whereas too thick a sheet adhesive joint could reduce the thermal conductivity between the parts to be joined. It is not necessary to use an electrically and/or thermally conductive elastomer since sufficient RF power can be supplied to the electrode through a thin area of the elastomeric joint due to capacitive coupling between the electrode and the support member.

FIG. 1 shows an embodiment where a plurality of recesses 48 are located in the backing plate 34 having flat rings of sheet adhesive 52 located therein to bond the mating surfaces of the inner electrode member 28 and the backing plate 38. The embodiment in FIG. 1 shows a recess 54 having a greater depth to accept a flat ring sheet adhesive 56. This embodiment also shows an RF gasket 80 between the inner electrode member 24 and the backing plate 34 near the periphery of the inner electrode member 24. In the embodiment of FIG. 1, the outer ring electrode 30 can be bonded to the backing ring 36 by a single flat ring of sheet adhesive 60 in a recess in the backing ring 58.

The mating surfaces of the electrode and support member can be planar or non-planar. For instance, one mating surface can be planar and the other can include a recess for receiving the sheet adhesive bonding material. Such a recess, for example, can protect the sheet adhesive from exposure to plasma. Alternatively, the mating surfaces can be contoured to provide an interlocking and/or self-aligning arrangement. In order to enhance adhesion of the elastomeric bonding material, the mating surfaces are preferably coated with a suitable primer. When the bonding material is formulated from the NUSIL TECHNOLOGY HCR-9800-30 material described above, the primer can be silicone primers under the trade name SP-120 or SP-270 manufactured by NUSIL TECHNOLOGY. Preferably, such primer is applied to the mating surfaces and dried prior to placing the sheet adhesive on the surface locations to be bonded.

The primer can be applied as a thin coating by any suitable technique such as wiping, brushing, spraying, preferably on discrete bonding surfaces of the showerhead assembly components to create bonding sites for the later applied bonding material. If the primer contains a solvent, application of the primer by wiping can enhance bonding by cleaning the surfaces. A siloxane containing primer reacts with air and creates silicon bonding sites when cured in air at room temperature. Such primers provide a visual indication of the amount of bonding sites with excessive primer locations appearing powdery.

The sheet adhesive is preferably between transfer sheets for handling. Preferably the transfer sheets are TEFLON manufactured by DUPONT. Transfer sheets are preferred to prevent, for example, deformation and damage to the uncured sheet adhesive. The sheet adhesive is applied to the mating surfaces or primed mating surfaces by removing one transfer sheet and applying the exposed surface of the adhesive sheet to a first mating surface, removing the other transfer sheet and applying a second mating surface to the other exposed surface of the adhesive sheet. The adhesive sheet surface can be tacky and preferably, tooling can be used to precisely remove the transfer sheets and place the sheet adhesive on the mating surfaces. Also preferably, the adhesive sheet on the mating surface can be placed under a vacuum to draw out any gaps or voids under the adhesive and apply a temporary seating load, such as by vacuum bagging.

After the sheet adhesive bonding material is applied to at least one of the surfaces, the parts can be assembled such that the surfaces are pressed together under compression, under a static weight, or by atmospheric pressure within a vacuum bag. Since the elastomer is in the form of a sheet adhesive it is not necessary to apply an initial slight pressure such as hand pressure to spread the elastomer throughout the joint to be formed. However a slight pressure such as hand pressure or light atmospheric load within a vacuum bag is required to seat the adhesive to the mating surfaces. After approximately five minutes or less of seating load, it is preferred to remove all loading on the adhesive. The curing should preferably be performed without any significant static weight or vacuum bag loads. The bond can be cured at elevated temperature in an atmospheric or protective gas environment. The assembly can be placed in a convection oven and heated to activate the crosslinking process of curing the bond. For example, a heat curable bond material can be treated at a primary cure temperature of between 110° C. and 122° C. (e.g., 116° C.) for 10 to 20 minutes (e.g., 15 minutes). Upon successful inspection of the assembly, the bond material is treated at a secondary cure temperature of between 140° C. and 160° C. (e.g., 150° C.) for 1.5 to 2.5 hours (e.g., 2 hours). Alternatively, only the secondary cure can be applied for 2.5 to 3.5 hours (e.g., 3 hours), skipping the primary cure.

Preferably, the sheet adhesive maintains its geometric shape such that the sheet adhesive does not bulge or flow during bonding and curing. However, the sheet adhesive volume change during curing can be up to 5% volume shrinkage. Preferably, the sheet adhesive undergoes no more than 2 to 3% volume shrinkage during curing.

During plasma processing, the elastomer bonded electrode assemblies are able to sustain high operation temperatures, high power densities, and long RF hours. Also, the use of sheet adhesive elastomer materials as a mechanism for joining electrode assemblies has additional advantages over non-sheet adhesives during plasma processing of semiconductor wafers.

Regions of the components with residual unused primer (unbonded areas) can be a source of contamination. For example, the use of siloxane primers (e.g., RHODIA SILICONES VI-SIL V-06C) has been determined to have potential to introduce levels of contamination, including titanium. The titanium contaminants may potentially react with the silicon substrate, forming titanium silicides in undesired regions of the substrate during the etching process.

A sheet adhesive allows reducing contamination originating from the primer material by selectively applying the primer to regions on the showerhead assembly (e.g. joining inner electrode member 24 with backing plate 34) where sheet adhesive bonding material will be subsequently applied, rather than coating all surfaces with the primer. FIG. 2 is a top view of inner electrode member 24, including a plurality of gas passages 32 extending through to a bottom plasma-exposed surface 26. In this embodiment, the sheet adhesive elastomeric material is applied as annular zone patterns 46 between regions containing gas passages 32. However, prior to applying the elastomeric material, primer can be applied in the same annular zones pattern corresponding to the elastomeric material.

While the sheet adhesive is shown as applied in annular zones, the pattern of applying sheet adhesive is not limited and can be applied in other patterns such as zones which are not annular. Sheet adhesive can be cut in any desired pattern and portions removed from the transfer sheet to allow transfer of discrete sections of the sheet adhesive to the parts to be joined.

The primer can be applied to the top surface 28 of the inner electrode member 24 in a predetermined pattern of bonding regions, surrounded by unbonded regions. In one example, the primer 46 can be applied by rotating inner electrode member 24 about its center point C, and applying the primer in patterns 46 with a dispenser (e.g., a felt-tip dispenser) by contacting one or more outlets of the dispenser at a single position or multiple radial positions relative to the center point C, generating one or more annular zones at a time. In another example, the annular zones pattern (or any desired pattern) can be applied by covering the top surface 28 of the inner electrode member 24 with a mask having openings in a predetermined pattern. However, the primer may be applied in any appropriate predetermined pattern (e.g., a plurality of discrete zones, radial and/or discontinuous annular zones), as long as the primer is applied only to regions underlying the sheet adhesive elastomer material. The primer can also be applied by wiping, brushing, spraying through the openings of the mask. Both of the above described methods can also be used for applying primer to the bottom surface 38 of backing plate 34. In applying the primer to only selected regions 46 underlying the sheet adhesive elastomeric material, contaminants associated with the application of the primer can be significantly reduced.

Examples of mask materials can include KAPTON®, a polyimide-based material, MYLAR®, a polyester-based material, or TEFLON® a fluoropolymer resin, all available from DU PONT.

Figure 3B:
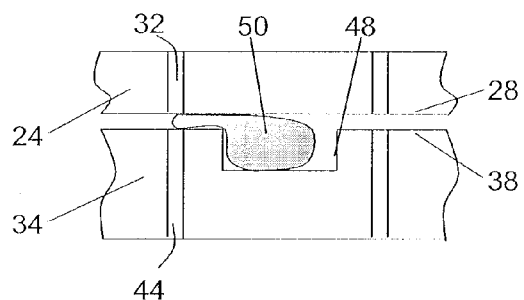
FIG. 3B illustrates the cross section shown in FIG. 3A after the inner electrode is bonded to the backing plate with the paste or liquid adhesive.
Figure 4A:
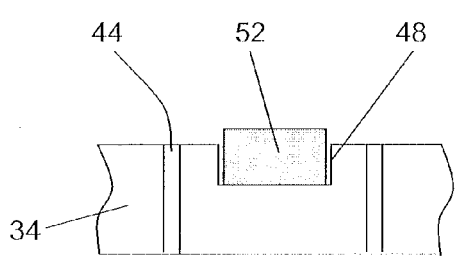
FIGS. 4A and 4B illustrate a cross section portion of an embodiment of the inner electrode shown in FIG. 1 bonded to the backing plate with sheet adhesive.

Another advantage the sheet adhesive has over liquid, gel and paste adhesives is control of flow or elimination of flow. For example, as shown in FIG. 3A, when the showerhead assembly components to be joined contain gas passages 32/44, the flow of liquid or paste uncured elastomeric material 50 must be controlled when the components are pressed together before the elastomer is cured. When the uncured paste 50 is applied between two components and pressed, it is difficult to control the flow of the uncured elastomer material. As shown in FIG. 3B, the uncontrolled flow of the uncured elastomeric material 50 can result in the obstruction or blockage of the gas passages 32/44. As a result, additional cleaning or machining can be required to clear the obstructed or blocked gas passages 32/44. The sheet adhesive elastomeric material can avoid such problems since the sheet adhesive 52 can be placed between the showerhead assembly components to be joined with much finer tolerances than a liquid or paste elastomeric material as shown in FIG. 4A. The sheet adhesive can be configured to exhibit good volume control so as to not ooze or flow into undesired areas. As such, the sheet adhesive elastomeric material 52 can be located closer than the liquid, paste or gel, to the gas passages 32/44 without risk of obstruction or blockage of the gas passages 32/44.

When the top electrode 12 and the backing member 14 are composed of materials with different coefficients of thermal expansion, the thickness of the elastomer material can be varied to accommodate the differences in thermal expansion. For example, the top electrode 12 can be silicon and the backing member 14 can be metallic (e.g., aluminum, stainless steel, copper, molybdenum, or alloys thereof). However, if two components with greater differences in thermal expansion coefficients are bonded (i.e., aluminum and silicon), upon heating during temperature curing or during operation of the electrode, a non-uniform shear stress is generated in the elastomeric bonding material, due to the different rates of thermal expansion. For example, if a circular aluminum backing member 14 is concentrically bonded to a circular silicon top electrode 12, the shear stress in the elastomeric bonding material near the center of backing member 14 and top electrode 12 is minimal at an elevated processing temperature. However, the outer portion of the aluminum backing member 14 undergoes a larger amount of thermal expansion than the outer portion of the silicon top electrode 12. As a result, when the two materials are bonded, the maximum shear stress occurs in the outer peripheral edge of the backing member 14 or top electrode 12, where the difference in thermal expansion is greatest.

Figure 4B:
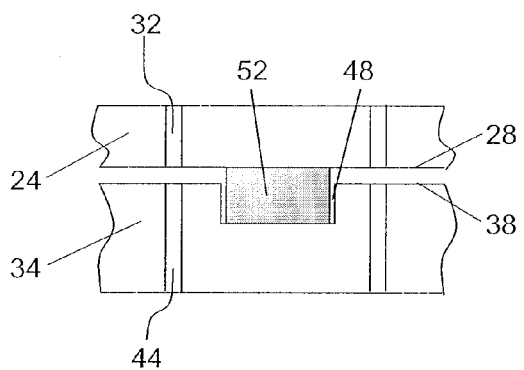

Adhesive in a sheet form can provide exceptional bond thickness control to precisely control parallelism of bonded surfaces over large areas such that inserts or spacers are not required to control bond thickness or parallelism. FIG. 4A shows an embodiment of the sheet adhesive 52 bonded to a recess 48 in the bottom surface of the backing plate 34 between gas passages 44. FIG. 4B shows the sheet adhesive 52 bonded to the bottom surface 38 of the backing plate 34 and the top surface 28 of the top electrode 24 between gas passages 32/44.

The sheet form allows exceptional volume control to limit or prevent oozing of adhesive into unwanted areas. The application of the sheet adhesive obviates need for precision dispensing equipment used to apply a liquid or paste adhesive. Issues with feed speeds of automated and/or manual dispensing procedures, and associated drying, necking or globing of adhesive dispense beads are thus eliminated. The sheet adhesive has more uniform suspension of thermal conductivity filler, an anticipated better shelf life, and can provide a more efficient and reliable manufacturing process.

Pre-form sheet adhesive shapes can be designed to conform to irregularly shaped planar features, and can be optimized to maximize surface contact area with the mating parts. For example, in FIG. 3A, the bead of liquid or paste adhesive 50 contacts the backing plate 34 along a curved surface of the bead 50 shown in cross section in recess 48. The contact area between the bead 50 and the mating surface of the backing plate 38 is narrower than the bead 50 and difficult to control uniformity and reproducibility of the bond. In FIG. 3B, when the electrode 24 is mated to the backing plate 34 the contact between the liquid or paste adhesive bead 50 and the mating surfaces of the backing plate and the electrode 38/28 is limited and difficult to control such that the contact area may be less than the diameter of the bead 50, requiring an excess of liquid or paste adhesive to achieve a desired contact area for suitable bond strength and thermal and/or electrical conductivity between the backing plate 34 and the electrode 24.

In FIG. 4A, the elastomeric sheet adhesive 52 precisely contacts the backing plate 34 along a predetermined surface of the adhesive sheet shown in cross section in recess 48 parallel to the backing plate surface. The contact area between the adhesive sheet 52 and the mating surfaces 38/28 of the backing plate 34 and the electrode 24 provides a maximum ratio of contact area to volume of elastomeric adhesive as shown in FIG. 4B. The greater contact area of the sheet adhesive 52 allows for less elastomeric sheet adhesive 52 to be used in a bond to achieve suitable thermal and/or electrical conductivity, bond strength and bond elasticity between the backing plate 34 and the electrode 24.

Figures 5A, 5B, 5C:
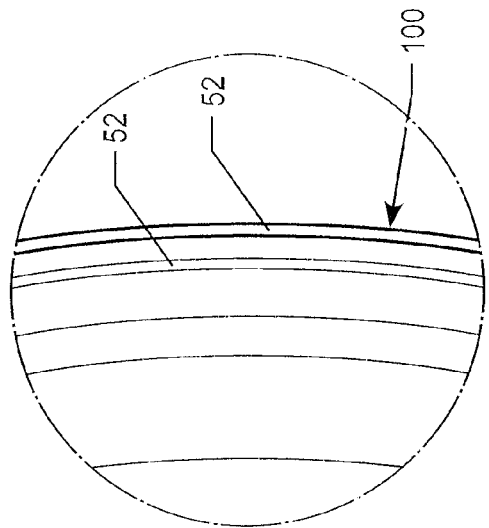
FIGS. 5A-5C illustrate an embodiment of a sheet adhesive cutting pattern.

Preferably, the sheet adhesive can be cut into pre-form shapes, by, for example, laser, water jet, die cut, plotter cutting and other cutting methods. The sheet adhesive can also be cast into pre-form shapes by, for example, casting such as tape casting, rolling or ink jet printing. FIGS. 5A-C show a preferred embodiment where sheet adhesive 100 is cut into flat rings 52. FIG. 5A shows a plan view of the sheet adhesive 100 and flat rings 52 of various inner and outer diameters, i.e., the flat rings can have various planar widths. FIG. 5B shows an edge view of the sheet adhesive embodiment in FIG. 5A. FIG. 5C shows a detailed view of area "A" of the sheet adhesive embodiment in FIG. 5A illustrating sheet adhesive rings of narrow planar width and large diameter cut from sheet 100. For example, sheet adhesive 100 can be 0.012 inches (305 μm) thick and flat rings 52 can have inner and outer diameters in inches of (0.195, 0.464), (0.854, 1.183), (1.573, 1.902), (2.725, 3.625), (4.449, 4.778), (5.168, 5.497), (6.320, 7.220), (8.043, 8.372), (9.196, 10.096), (10.919, 11.248), (11.638, 11.724), and (11.913, 12.000).

Figure 7:
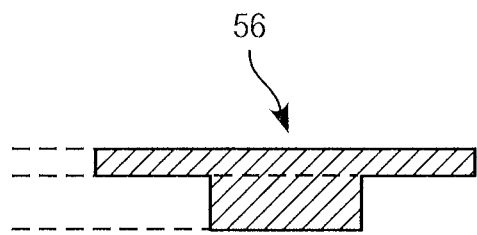
FIG. 7 illustrates a detail of an embodiment of a flat ring of sheet adhesive having an elevation jog shown in FIG. 6.
Figure 8:
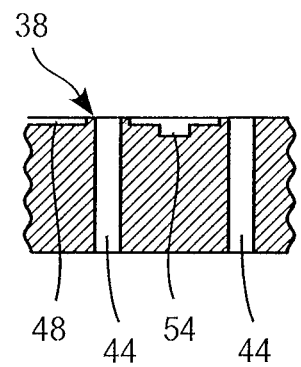
FIG. 8 illustrates a detail of a recess in the backing plate shown in FIG. 6.

Preferably, the sheet adhesive and flat rings of sheet adhesive 52 are cut, handled and transferred as laminates between transfer sheets of TEFLON (not shown). FIG. 6 shows a cross section of the flat rings of sheet adhesive 52 positioned over recesses 48 in the mating surface 38 of the backing plate 34 (the backing plate 34 is inverted). Such recesses 48 are in the form of racetrack grooves. Although not preferred, a flat ring of sheet adhesive can have an elevation jog. FIG. 6 shows a flat ring sheet adhesive 56 has an elevation jog such that the flat ring has a varying thickness along its planar width. The flat ring sheet adhesive 56 matches a racetrack groove 54 in the backing plate 34. FIG. 7 shows a detailed view "B" of the elevation jog in the sheet adhesive ring 56 shown in FIG. 6 wherein the sheet adhesive ring is thicker in the center of the ring. Such an elevation jog can be made, for example, by laminating flat rings of sheet adhesive having different radial widths and/or different axial heights (thickness). FIG. 8 shows a detailed view "D" of the recess 54 in the backing plate 34 formed to accept the sheet adhesive ring 56.

Figure 9:
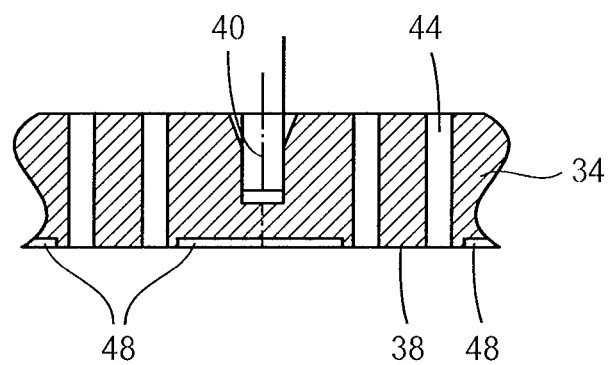
FIG. 9 illustrates a cross section of an embodiment of a backing plate.

FIG. 9 shows a detailed view "E" of the backing plate 34 (non-inverted) shown in FIG. 6. The recesses 48 in mating surface 38 can be located to precisely control the bonded and unbonded regions. The unbonded regions can be 1 to 95% of the surface area of the mating surface 38. For example, the unbonded region can be 1-5%, 5-10%, 10-15%, 15-20%, 20-30%, 30-40%, 40-50%, 50-60%, 60-70%, 70-80%, 80-90%, or 90-95% of the surface area of the mating surface 38. The gas passages 44 are in the unbonded regions and the sheet adhesive bonds the bonded regions. A distance between an edge of a sheet adhesive, for example, a flat ring 52 inner or outer diameter and a gas passage 44 opening in surface 38 can be precisely controlled to optimize bond properties and as previously mentioned, eliminate risk of blockage of gas passages 44 by oozing or bulging of a non-sheet elastomeric adhesive. Preferably, the sheet adhesive essentially maintains its original size and maintains the same shape before, during and after curing with little or no shrinkage, for example, 2-3% volumetric shrinkage after curing.

Figure 10:
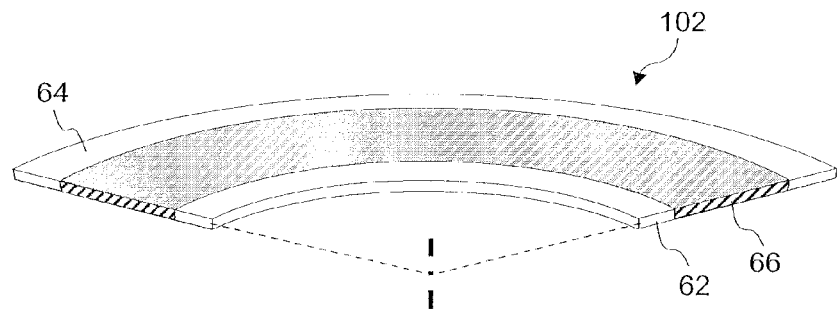
FIG. 10 illustrates embodiments of a sheet adhesive having different coplanar properties.

As a preferred embodiment the sheet adhesive can be composite layers of flat rings of various planar width having one or more different physical properties in a thickness direction (laminated) or a planar direction (co-planar). FIG. 10 shows a portion of a flat ring sheet adhesive 102 having different co-planar physical properties. For example, inner portion 62 and outer portion 64 can be unfilled silicone elastomer sheet adhesive for low particulate contamination release and middle portion 66 can contain $Al_2O_3$ particles for thermal conductivity.

Figure 11:
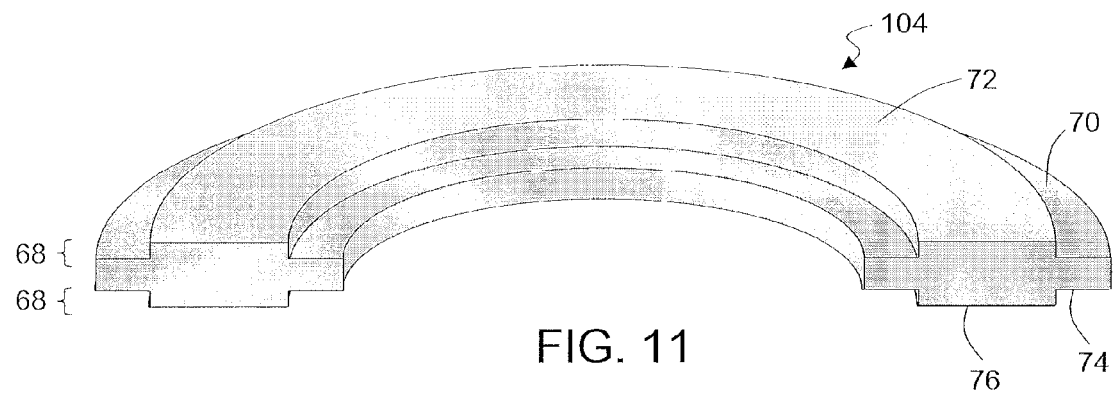
FIG. 11 illustrates an embodiment of a sheet adhesive having elevation jogs.

FIG. 11 shows an embodiment of a sheet adhesive 104. The sheet adhesive 104 may be a plurality of flat circular or semi-circular rings of various widths having elevation jogs 68 (small steps). Surfaces 70 and 72 may bond to recesses in an electrode mating surface (not shown, but similar to recesses 48, 54 and 58 in backing member 14) or surface 70 may bond to an electrode mating surface without recesses such as the inner electrode mating surface 28 and/or the mating surface of outer electrode ring 30. Surfaces 74 and 76 may bond to recesses in a backing member 14 mating surface similar to recesses 48, 54 and 58 or surface 76 may bond to a backing plate and/or backing ring mating surface without recesses (not shown).

Figure 12:
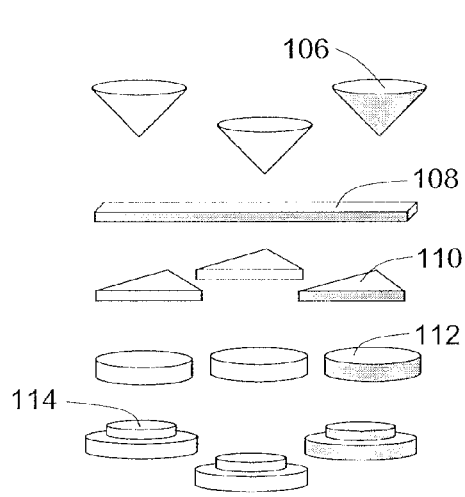
FIG. 12 illustrates embodiments of sheet adhesive in various shapes.
Figure 13:
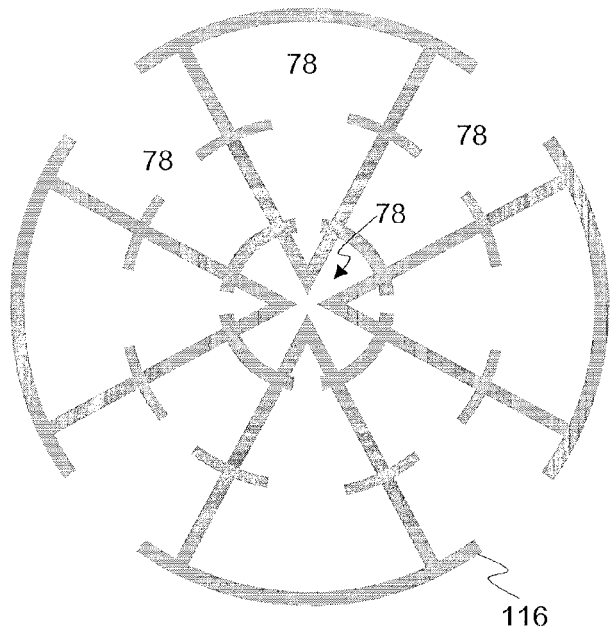
FIG. 13 illustrates an embodiment of a sheet adhesive.

By way of example, the sheet adhesive can be arranged as an uniform or non-uniform pattern of dots, triangles, columns and other geometric shapes of various widths and thicknesses without limitation. FIG. 12 shows cones 106, rectilinear strips 108, triangles 110, circular dots 112 and circular dots having elevation jogs 114 of sheet adhesive. The sheet adhesive can be a plurality of such geometric shapes to bond the bonding regions on the mating surfaces of the backing member 14 and electrode 12. However, in another embodiment the sheet adhesive can be a single sheet having a "spider web" geometric shape to precisely match to bonding regions while leaving unbonded regions for gas passages 32/44. FIG. 13 shows an embodiment of a single sheet 116 in plan view for bonding, for example, mating surfaces 28 and 38. Accordingly, spaces 78 in the sheet adhesive 116 can correspond to unbonded regions. In this embodiment such unbonded regions would correspond to greater than 90% of the mating surface area.

Before curing, the sheet adhesive preferably has a physically stable nature. The sheet adhesive before curing is an unvulcanized, uncross-linked composition having dimensional stability. The uncured sheet adhesive can be malleable. As mentioned, transfer sheets are preferred for handling the uncured sheet adhesive to prevent deforming the sheet adhesive before curing. Upon heating, a cross-linking agent such as a peroxide filler preferably cures the sheet adhesive in the overall same shape as the uncured sheet adhesive. After curing, the sheet adhesive returns to the same shape after mechanical forces are removed. Greater contact area control increases thermal and/or electrical conductivity between the adhered parts. The cured sheet adhesive also maintains comparable elasticity at high volumes of filler particles to that of the cured gel elastomers and greater elasticity at high volumes of filler particles than the cured liquid and paste elastomers. By using high volumes of filler particles in the elastomeric sheet adhesive greater thermal and/or electrical conductivity can be achieved between the adhered parts for a given volume of elastomeric adhesive without sacrificing bond strength or elasticity.

Preferably, pre-form shapes are installed into captivating cavities 48 of the mating assembly. Installation can be performed by such methods as manually, manually with installation tooling, or with automated machinery. The adhesive sheet can be formulated to have limited or unlimited work time, and then heat cured when curing is convenient.

As illustrated in FIGS. 4A and 4B, backing member 34 is joined to inner electrode 24 such that the first gas passages 32 of the inner electrode 24 and the second gas passages 44 of the backing member 34 are in fluid communication. To enhance adhesion, a primer 46 can also be applied to bottom surface 38 of the backing member 34 in the same predetermined pattern as applied to the top surface 28 of inner electrode member 24. In alternative embodiments, backing member 34 or inner electrode member 24 may contain plenums to distribute one or more gas supplies in a desired gas distribution pattern. In another embodiment, gas passages 32 can be in fluid communication with one or more gas passages 44.

In a preferred embodiment, the sheet adhesive bonds the top surface of the electrode 28 to the bottom surface of the backing plate 38 such that there is a 51 to 381 μm (0.002 to 0.015 in) gap therebetween in unbonded regions. For example, a depth of the recess 48 on the backing plate bottom surface and/or the electrode top surface is preferably 102 to 508 μm (0.004 to 0.020 in), for example 100 to 200 μm or 200 to 500 μm. More preferably, the recess 48 is 178 μm (0.007 in) deep. However, the backing plate bottom surface and the electrode top surface can be bonded by the sheet adhesive without a recess. Also preferably, the sheet adhesive bonds the backing plate bottom surface parallel to the electrode top surface with a distance between the two mating surfaces varying by less than +/−25 μm (0.001 in).

The backing plate 34 is attached to thermal control plate 16 by suitable fastener members described for example, in commonly-owned U.S. Patent Application Publication No. 2007/0068629 which is incorporated herein by reference in its entirety. The backing member 34 contains a plurality of holes 40 adapted to receive fastener members 42 for attaching the backing member 34 to a thermal control plate 16.

EXAMPLES

Figure 14:
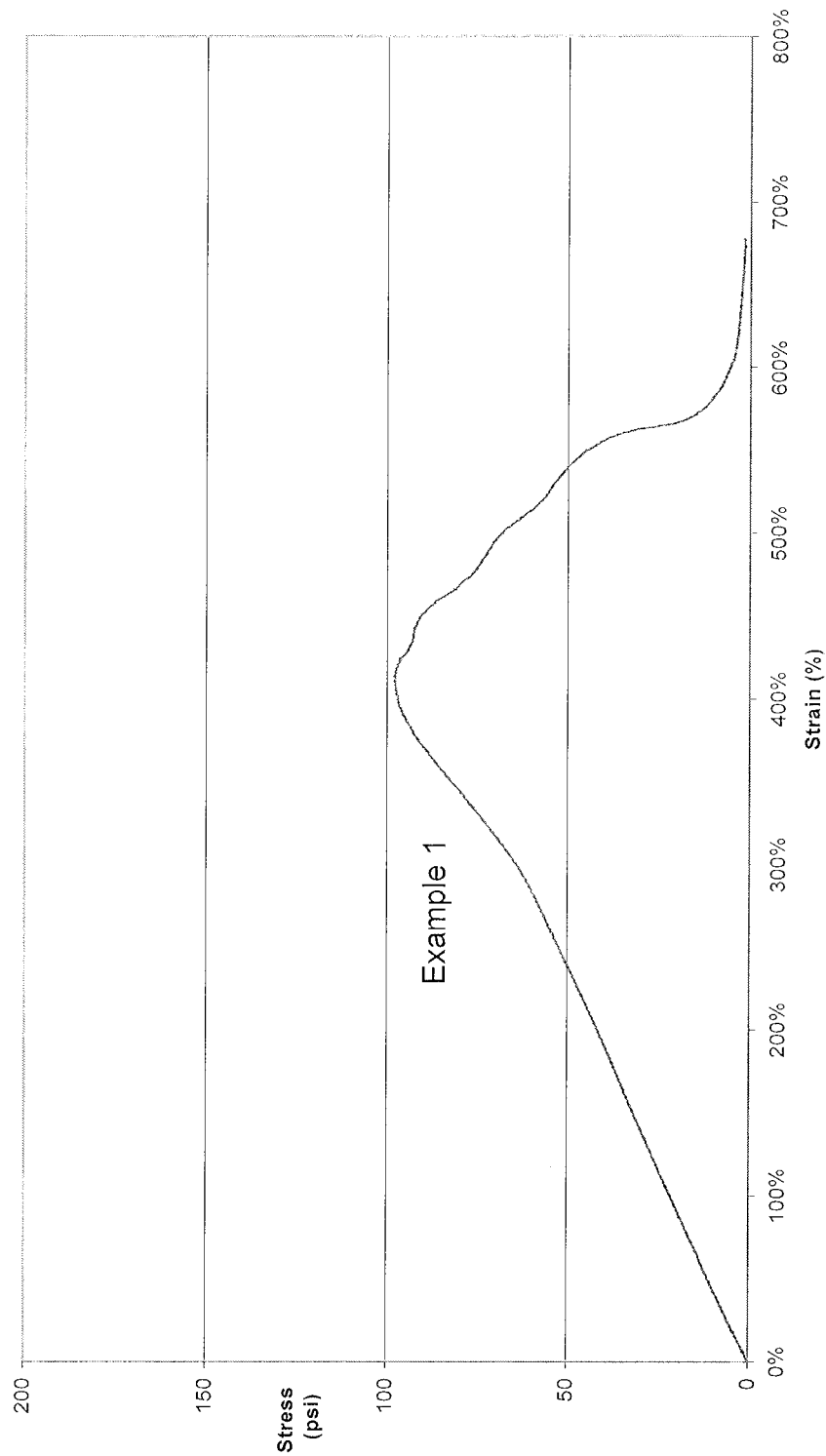
FIG. 14 shows a shear test result conducted at room temperature for sheet adhesive Example 1.

Nonlimiting examples of sheet adhesive were formulated as described above, heat cured and tested. Test specimens were made of the sheet adhesive to simulate the performance of the sheet adhesive in a bond between mating surfaces, however it should be noted that test results of actual bonds between electrodes and backing members are not shown here. Shear tests were conducted at room temperature and elevated temperatures, for example, at 180° C. Elevated temperature fatigue tests were conducted at, for example, 180° C. FIG. 14 shows a shear test result of Example 1 sheet adhesive at room temperature. Example 1 shows a near linear stress-strain curve to over 300% shear strain and a low shear stress at high shear strains. A bond made of such a soft sheet adhesive can be suitable to accommodate high shear strains without diaphraming of bonded electrode and backing plates by coupling forces.

Figure 15:
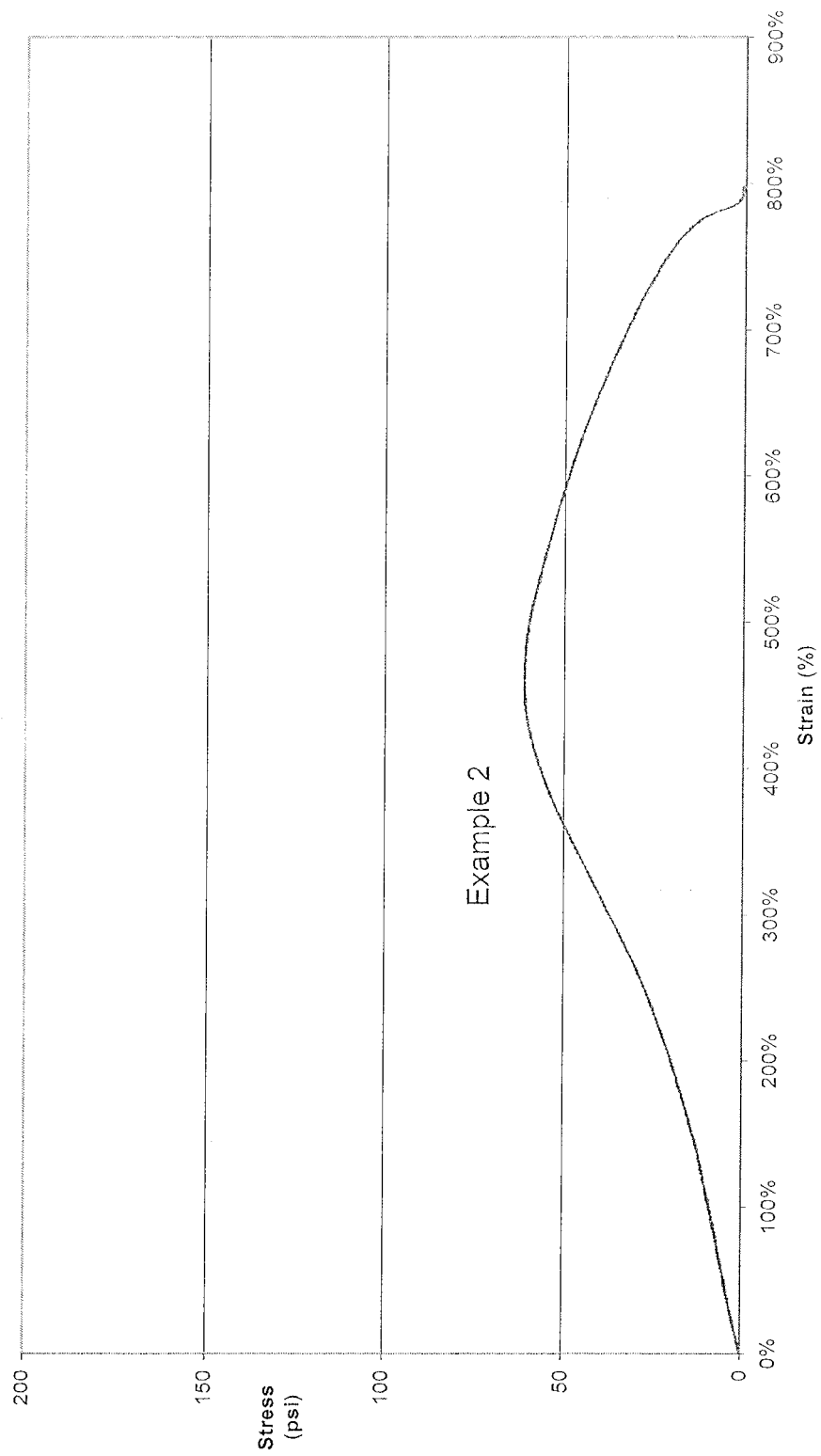
FIG. 15 shows a shear test result conducted at 180° C. for sheet adhesive Example 2.
Figure 17:
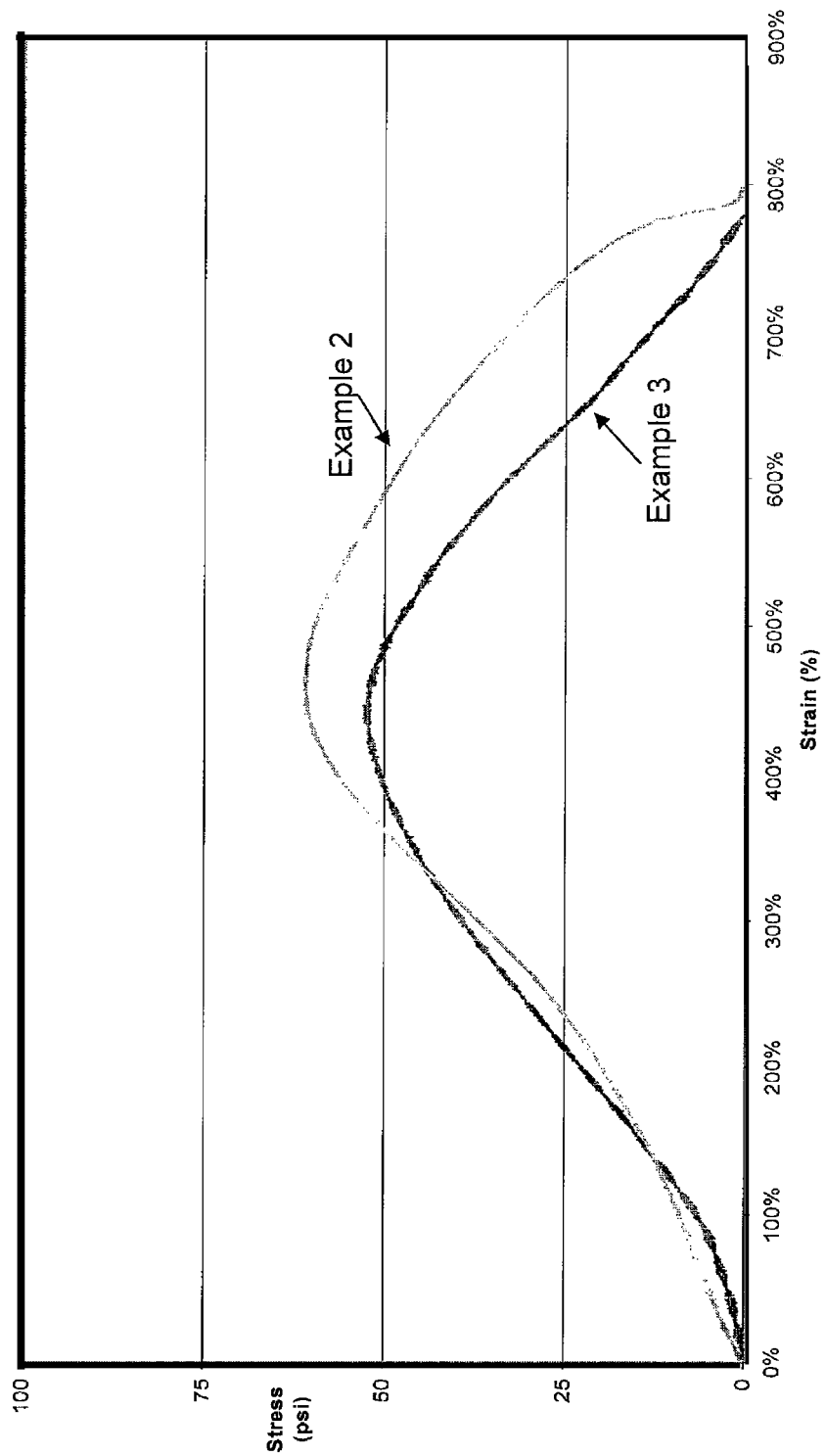
FIG. 17 shows a shear test result conducted at 180° C. for sheet adhesive Example 3 after the fatigue test.

FIGS. 15 and 17 show a shear test result of Example 2 sheet adhesive at 180° C. Example 2 experiences a near linear stress-strain curve to over 300% shear strain at 180° C. and a low strength at high strains. Such a soft sheet adhesive bond can be suitable to accommodate high shear strains without diaphraming of bonded electrode and backing plate.

Figure 16:
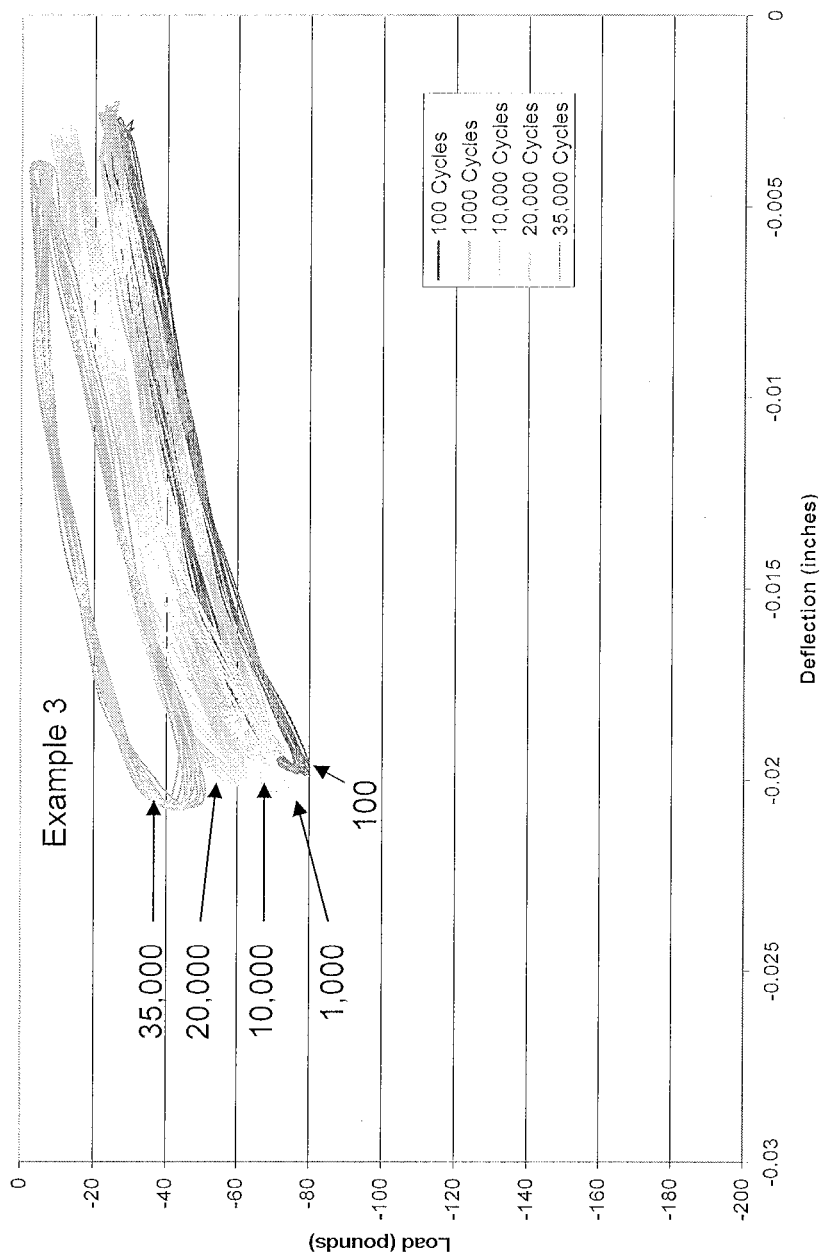
FIG. 16 shows a fatigue test result conducted at 180° C. for sheet adhesive Example 3.

FIG. 16 shows a fatigue test result of Example 3 sheet adhesive at 180° C. The fatigue test was conducted to more than 36,000 cycles (about 35,000 shown). Although only specimens of sheet adhesive were tested, each cycle simulates a thermal cycle where a backing plate expands by a different amount than an electrode during plasma processing due to differences in coefficients of thermal expansion of the materials of the backing plate and electrode. FIG. 17 shows a shear test result of Example 3 sheet adhesive at 180° C. after the fatigue test to over 36,000 cycles. Example 3 exhibits a near linear stress-strain curve to over 300% shear strain at 180° C. and a low strength at high strains. For instance, Example 3 exhibits a near linear stress-strain curve in a range of about 0% to about 450% shear strain. Such a soft sheet adhesive bond can be suitable to accommodate high shear strains without diaphraming of bonded electrode and backing plate even after over 36,000 temperature cycles.

While the invention has been described in detail with reference to specific embodiments thereof, it will be apparent to those skilled in the art that various changes and modifications can be made, and equivalents employed, without departing from the scope of the appended claims.

What is claimed is:

1. A composite showerhead electrode assembly for generating plasma in a plasma processing apparatus, comprising:
a backing plate comprising top and bottom surfaces with first gas passages therebetween, the bottom surface having bonded and unbonded regions, the first gas passages having outlets in unbonded regions to supply a process gas to an interior of the plasma processing apparatus;
an electrode plate having a top surface, a plasma exposed bottom surface, and second gas passages extending therebetween and in fluid communication with the first gas passages, wherein the second gas passages have inlets in unbonded regions of the top surface of the electrode plate; and
an elastomeric sheet adhesive joint disposed between mating surfaces at each of the bonded regions which allows movement in a lateral direction of the electrode plate relative to the backing plate during temperature cycling due to mismatch of coefficients of thermal expansion in the electrode plate and the backing plate;
wherein (a) the elastomeric sheet adhesive joint comprises an elastomeric sheet adhesive cast or rolled into a pre-form shape; (b) the elastomeric sheet adhesive joint comprises an elastomeric sheet adhesive of die cut pre-form shape; (c) the elastomeric sheet adhesive joint comprises an elastomeric sheet adhesive laser cut, plotter cut and/or water jet cut pre-form shape; and/or (d) one of the mating surfaces comprises a cavity; and
wherein the elastomeric sheet adhesive joint comprises a thermally conductive silicone adhesive sheet and wherein at least one portion of the conductive silicone adhesive sheet has a thermal conductivity of 0.5 W/mK to 0.8 W/mK, at least one portion of the conductive silicone adhesive sheet has a thermal conductivity of 0.8 W/mK to 1 W/mK and/or at least one portion of the conductive silicone adhesive sheet has a thermal conductivity of over 1 W/mK.

2. The composite showerhead electrode assembly of claim 1, wherein
the backing plate comprises an inner backing plate and an outer backing ring, the outer backing ring surrounding the inner backing plate, wherein the first gas passages are in at least one of the inner backing plate and the outer backing ring, the electrode plate comprises an inner showerhead electrode bonded to the inner backing plate and an outer ring electrode bonded to the outer backing ring, wherein the second gas passages are in at least one of the inner showerhead electrode and the outer ring electrode.

3. The composite showerhead electrode assembly of claim 2, wherein (a) the mating surface of the backing plate is parallel to the mating surface of the electrode plate and/or (b) the electrode plate is of single crystal silicon, polycrystalline silicon, graphite or silicon carbide; and the backing plate is of aluminum, graphite, or silicon carbide.

4. A composite showerhead electrode assembly for generating plasma in a plasma processing apparatus, comprising:
a backing plate comprising top and bottom surfaces with first gas passages therebetween, the bottom surface having bonded and unbonded regions, the first gas passages having outlets in unbonded regions to supply a process gas to an interior of the plasma processing apparatus;
an electrode plate having a top surface, a plasma exposed bottom surface, and second gas passages extending therebetween and in fluid communication with the first gas passages, wherein the second gas passages have inlets in unbonded regions of the top surface of the electrode plate; and
an elastomeric sheet adhesive joint disposed between mating surfaces at each of the bonded regions which allows movement in a lateral direction of the electrode plate relative to the backing plate during temperature cycling due to mismatch of coefficients of thermal expansion in the electrode plate and the backing plate;
wherein the elastomeric sheet adhesive joint comprises a thermally conductive silicone adhesive sheet; and wherein the elastomeric sheet adhesive joint is elastically deformable in the lateral direction to at least 200% shear strain from a shear stress of about 20 to 340 psi in a temperature range of room temperature to 300° C.

5. The composite showerhead electrode assembly of claim 4, wherein the elastomeric sheet adhesive joint is elastically deformable in the lateral direction to at least 300% shear strain from a shear stress of about 20 to 80 psi.

6. The composite showerhead electrode assembly of claim 4, wherein the electrode plate is a disk of single crystal silicon with a diameter of at least 200 mm and the elastomeric sheet adhesive joint is elastically deformable in the lateral direction to at least 200% shear strain from a shear stress of about 20 to 340 psi in a temperature range of room temperature to 300° C. after 5000 temperature cycles of heating the showerhead electrode assembly from room temperature to 250° C.

7. The composite showerhead electrode assembly of claim 1, wherein the thermally conductive silicone adhesive sheet comprises two or more laminated layers having different physical properties and/or the thermally conductive silicone adhesive sheet comprises two or more co-planar portions having different physical properties.

8. The composite showerhead electrode assembly of claim 1, wherein (a) the elastomeric sheet adhesive joint further comprises a primer on one or more of the mating surfaces of the backing member and/or the electrode backside; and/or (b) the thermally conductive silicone adhesive sheet comprises a uniform distribution of thermally conductive filler.

9. The composite showerhead electrode assembly of claim 8, wherein (a) the thermally conductive filler is one of boron nitride (BN), aluminum oxide ($Al_2O_3$), silicon, silicon carbide, and a combination thereof and/or (b) the thermally conductive silicone adhesive sheet is of (i) high molecular weight dimethyl silicone and the thermally conductive filler, (ii) high molecular weight dimethyl silicone and the thermally conductive filler matrixed around fiberglass screen (scrim), (iii) high molecular weight dimethyl silicone and the thermally conductive filler matrixed around metallic screen or (iv) high molecular weight dimethyl silicone and the thermally conductive filler mixed with glass microbeads, or nanobeads.

10. A composite showerhead electrode assembly for generating plasma in a plasma processing apparatus, comprising:
a backing plate comprising top and bottom surfaces with first gas passages therebetween, the bottom surface having bonded and unbonded regions, the first gas passages having outlets in unbonded regions to supply a process gas to an interior of the plasma processing apparatus;
an electrode plate having a top surface, a plasma exposed bottom surface, and second gas passages extending therebetween and in fluid communication with the first gas passages, wherein the second gas passages have inlets in unbonded regions of the top surface of the electrode plate; and
an elastomeric sheet adhesive joint disposed between mating surfaces at each of the bonded regions which allows movement in a lateral direction of the electrode plate relative to the backing plate during temperature cycling due to mismatch of coefficients of thermal expansion in the electrode plate and the backing plate; wherein a gap distance between the mating surfaces varies by less than ±25 µm (0.001 in).

11. The composite showerhead electrode assembly of claim 1, wherein (a) the cavity depth is in a range of 100 to 200 µm; (b) the cavity depth is in a range of 200 to 500 µm; (c) the cavity comprises an elevation jog sized to match a dimension of the sheet adhesive; (d) the sheet adhesive bonds the top surface of the electrode to the bottom surface of the backing member with a spacing therebetween of 50 to 400 µm; (e) the sheet adhesive joint comprises a silicone adhesive sheet in a form of a single sheet; (f) the sheet adhesive joint comprises a silicone adhesive sheet in a form of one or more flat rings, flat rings with elevation jogs, cylinders, flat or columnar polygons, blocks or combination thereof; and/or (g) the elastomeric sheet adhesive joint comprises a heat cured adhesive.

12. A composite showerhead electrode assembly for a plasma processing apparatus, comprising:
a backing member having a bottom surface with regions to be bonded, excluding regions to remain unbonded, and a plurality of first gas passages extending between the bottom surface and a top surface of the backing member, wherein the first gas passages have outlets in regions to remain unbonded, to supply a process gas to an interior of a plasma processing apparatus;
an electrode to generate plasma in the plasma processing apparatus, the electrode having a top surface with regions to be bonded and a plurality of second gas passages in fluid communication with the first gas passages, the second gas passages have inlets in regions to remain unbonded, extending through the electrode from the top surface to a plasma-exposed bottom surface of the electrode; and
an uncured elastomeric sheet adhesive to be cured in a joint between mating surfaces of each of the regions to be bonded to allow movement in the lateral direction of the electrode relative to the backing member during temperature cycling due to mismatch of coefficients of thermal expansion of the backing member and electrode, wherein the sheet of elastomeric adhesive is a filled, heat-curable, unvulcanized elastomeric silicone sheet; and wherein the uncured elastomeric sheet adhesive is formulated with a peroxide as a heat activated component to perform a cross-linking reaction, the elastomeric sheet adhesive volume shrinkage is 3-5% during curing, or less than 3% during curing.

* * * * *